United States Patent [19]
Sun

[11] Patent Number: 5,886,375
[45] Date of Patent: *Mar. 23, 1999

[54] SRAM HAVING IMPROVED SOFT-ERROR IMMUNITY

[75] Inventor: Shih-Wei Sun, Hsin-Chu, Taiwan

[73] Assignee: United Microelectronics Corporation, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 735,007

[22] Filed: Oct. 22, 1996

Related U.S. Application Data

[60] Provisional application No. 60/019,850, Jun. 17, 1996.
[51] Int. Cl.[6] .................. H01L 27/108; H01L 29/76; H01L 29/94; H01L 31/119
[52] U.S. Cl. .................. 257/296; 257/369; 257/903
[58] Field of Search .................. 257/296, 903, 257/369

[56] References Cited

U.S. PATENT DOCUMENTS

| | | |
|---|---|---|
| 5,480,826 | 1/1996 | Sugahara et al. . |
| 5,618,747 | 4/1997 | Lou . |
| 5,619,055 | 4/1997 | Meguro et al. . |
| 5,639,685 | 6/1997 | Zahurak et al. . |

OTHER PUBLICATIONS

Ikeda, S. et al., *A Stacked Split Word–Line (SSW) Cell for Low Voltage Operation, Large Capacity, High Speed SRAMs*, IEDM, IEEE, 1993, pp. 809–812.

*Primary Examiner*—Stephen D. Meier
*Attorney, Agent, or Firm*—Rabin & Champagne, P.C.

[57] ABSTRACT

An SRAM cell having improved soft error immunity connects each of the storage nodes of the SRAM cell to an overlying electrode having a textured surface which is separated from a constant potential plate electrode by a dielectric layer. The textured surface of the overlying electrode may be created by forming hemispherical-grained silicon on its surface, or by forming a fin structure on its surface. The textured surface of the overlying electrode provides increased capacitance between the overlying electrode and the constant potential plate electrode, thereby increasing the capacitance of the storage node.

18 Claims, 5 Drawing Sheets

SRAM HAVING IMPROVED SOFT-ERROR IMMUNITY

This application claims priority from provisional application Serial No. 60/019,850, filed Jun. 17, 1996.

BACKGROUND OF THE INVENTION

1. Field of the Invention

The present invention relates to static random access memories (SRAMs) and, more particularly, to SRAMs which have improved levels of reliability.

2. Description of the Related Art

Reduced geometry integrated circuit designs are adopted to increase the density of devices within integrated circuits, thereby increasing performance and decreasing the cost of the integrated circuits. Modern integrated circuit memories, including DRAMs, SRAMs, ROMs, EEPROMS, etc., are prominent examples of the application of this strategy. The density of memory cells within integrated circuit memories continues to increase, accompanied by a corresponding drop in the cost per bit of storage within such devices. Increases in density are accomplished by forming smaller structures within devices and by reducing the separation between devices or between the structures that make up the devices. Often, these smaller design rules are accompanied by layout, design and architectural modifications which are either made possible by the reduced device sizes or are necessary to maintain performance when such smaller design rules are implemented. As an example, the reduced operating voltages used in many conventional integrated circuits are made possible by improvements in design, such as reduced gate oxide thicknesses and improved tolerance controls in lithographic processing. On the other hand, reduced design rules make reduced operating voltages essential to limit the effects of hot carriers generated in small size devices operating at higher, previously conventional operating voltages.

Making static random access memories (SRAMs) in accordance with smaller design rules, as well as using reduced internal operating voltages, can reduce the immunity of SRAMs to alpha-particle generated soft errors, thereby reducing the reliability of the SRAMS. Most SRAM designs include four or six MOS transistors cross-coupled together in a latch configuration, with one of the most basic designs including four transistors connected to form cross-coupled inverters. In such a cross-coupled inverter design, the coupled gates of each inverter, along with the diffusion regions directly connected to those gates, form a charge storage node for the memory cell. Thus, there are two charge storage nodes within each SRAM memory cell. Typically, the cross-coupled inverters form a latch having two stable states: one state with a predefined level of charge stored on a first charge storage node and no charge stored on a second charge storage node; and a second state with no charge stored on the first charge storage node and the predefined level of charge stored on the second charge storage node. Binary data is recorded by toggling between the two states of the latch. Sufficient charge must be stored on the charge storage node, and thus on the coupled gates of associated inverter, to unambiguously hold one of the inverters "ON" and the other of the inverters "OFF", thereby preserving the memory state. This memory state is conventionally read out using a differential sense amplifier, so it is the difference in charge levels stored on the two charge storage nodes which must be maintained above a desired level to preserve the performance of the SRAM.

Reduced design rules in SRAMS reduce the size of the transistor gates and of the connected diffusion regions, thereby reducing the capacitance of the charge storage nodes. By reducing the capacitance of the nodes or by reducing the voltage at which charge is stored on the nodes, conventional SRAM designs store reduced levels of charge on the nodes. Reducing the amount of charge stored on the nodes of an SRAM makes it more likely that an undesired charge generation event in the SRAM in the substrate adjacent one of the storage nodes, such as might be associated with alpha particles, can reduce the difference in the charge levels stored on the nodes of the SRAM memory cell to an unacceptably small level and increase the likelihood that an erroneous binary data state will be detected when reading data from the SRAM memory cell.

SUMMARY OF THE PREFERRED EMBODIMENTS

It is therefore an object of the present invention to provide an SRAM having improved immunity to soft errors generated by alpha particles or other soft error generation mechanisms. Most preferably, the SRAM has the higher density and performance related to the use of reduced design rules, but with comparatively better reliability.

Preferred embodiments of the present invention couple one or both of the charge storage nodes of an SRAM memory cell to a corresponding electrode in such a manner as to increase the capacitance of the charge storage node(s). For example, a charge storage node may be connected to a first electrode having a textured surface, with the first electrode covered by a dielectric layer which, in turn, is covered by a second electrode connected to a fixed potential. In some preferred embodiments of the present invention, the SRAM memory cell may be of the six transistor configuration, where the two load transistors are thin film transistors formed on a level above the other four transistors. In such embodiments, the first electrode might be the polysilicon top gate electrode of one of the thin film transistor load devices. This first electrode might have an upper surface with "rugged" or hemispherical grained polysilicon on its surface and the second electrode might be the polysilicon $V_{CC}$ plate. Alternatively, a fin structure might be formed on the surface of the TFT gate and the finned gate structure can serve as the first electrode of the charge storage capacitor.

Some embodiments of the invention provide an SRAM comprising word lines and bit lines for accessing SRAM cells. The SRAM cells comprise a first transistor having a first gate and a first source/drain region connected to a first charge storage node. A second transistor has a second gate and a second source/drain region connected to a second charge storage node. The first gate is connected to the second charge storage node and the second gate is connected to the first charge storage node. A first charge storage capacitor is connected to the first charge storage node, where the first charge storage capacitor has a textured lower electrode, a dielectric layer and an upper electrode connected to a constant potential.

Particular aspects of these embodiments include an SRAM, wherein the textured lower electrode comprises doped polysilicon and has a surface layer comprising hemispherical grained polysilicon. Other aspects of these SRAMs provide a textured lower electrode with a surface layer with a texture corresponding to etched hemispherical grained polysilicon. Still other aspects provide a textured lower electrode having a plurality of conductors extending vertically from a core portion of the textured lower electrode.

Another aspect of the present invention provides an SRAM having cells comprising a first inverter coupled between a high reference potential and a lower reference potential, the first inverter comprising a first load transistor and a first pull-down transistor, a drain of the first load transistor coupled to a drain of the first pull-down transistor, a gate of the first load transistor coupled to a gate of the first pull-down transistor and a second inverter coupled between the high reference potential and the lower reference potential, the second inverter comprising a second load transistor and a second pull-down transistor, a drain of the second load transistor coupled to a drain of the second pull-down transistor, a gate of the second load transistor coupled to a gate of the second pull-down transistor, the gate of the second pull-down transistor coupled to the drain of the first pull-down transistor and the gate of the first pull-down transistor coupled to the drain of the second pull-down transistor. A first capacitor is connected between the gate of the first load transistor and the high reference potential and includes first means for increasing capacitance above a parallel plate capacitance level. A second capacitor is connected between the gate of the second load transistor and the high reference potential and includes second means for increasing capacitance above a parallel plate capacitance level.

In particular embodiments, the first and second means might be polysilicon having a textured surface derived from hemispherical grained polysilicon. Other embodiments may have first and second means consisting of polysilicon fins or columns.

DETAILED DESCRIPTION OF THE PREFERRED EMBODIMENTS

Figure 1:
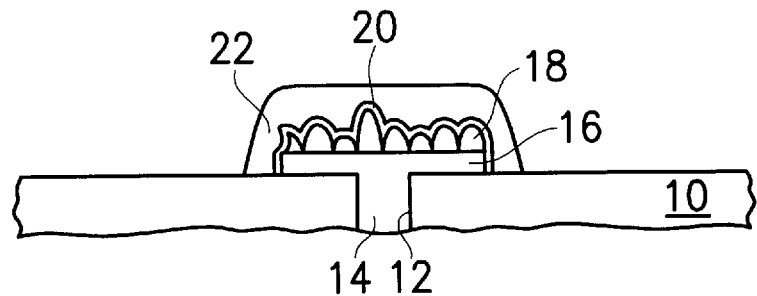
FIGS. 1 and 2 illustrate capacitors connected to a charge storage node of an SRAM cell, in accordance with preferred embodiments of the present invention.

Preferred embodiments of the present invention improve the soft error immunity of SRAMs by increasing the capacitance of the nodes of the memory cell. Increasing the capacitance of the charge storage nodes within the SRAM cell increases the amount of charge that is stored on a node to indicate a particular data state, even for lower levels of operating voltage. By increasing the amount of charge stored on the node, random charge generation events such as those associated with alpha particles will not reduce the amount of stored charge to a level below that desired to discriminate between data states.

A preferred method of increasing the capacitance on the charge storage nodes of the SRAM cell is to connect the charge storage nodes to respective extra charge storage capacitors. Because it is desirable to conserve substrate surface area, this capacitor is preferably formed on a layer above the substrate layer on which the pull-down and transfer transistors are typically formed within the SRAM. Preferably, the pull-down and transfer transistors are covered with a layer of insulating material and the extra charge storage capacitor is formed on this layer of insulating material. Contact vias are formed through the insulating layer down to each of the charge storage nodes of the SRAM cell, typically making contact with one of the conductors that forms a part of the respective charge storage nodes. Vertical interconnects extend from the charge storage nodes to the surface of the layer of insulating material and into contact with a lower electrode of the capacitor. The lower electrode of the capacitor is preferably formed from a layer of conductive material deposited on the layer of insulating material, and is preferably doped polysilicon because of the compatibility of doped polysilicon with the processing used to form the SRAM. The capacitor also includes a dielectric layer formed over the lower electrode and an upper capacitor electrode provided on the dielectric layer, with the dielectric layer preferably being thin to leave as little separation between the lower and upper capacitor electrodes as is practical and reliable.

When extra charge storage capacitors are connected to each of the nodes of an SRAM cell, the amount of charge that can be stored on each of the nodes is increased. It is, of course, preferable that a similar charge storage capacitor be provided for each of the nodes within the SRAM cell, since it is preferable for the SRAM cell to be symmetric. It would nevertheless be possible to provide only a single charge storage capacitor for each SRAM cell, if significant changes were made in the operating characteristics of the conventional SRAM.

To provide a further increase in capacitance, the surface of the lower capacitor electrode is preferably textured in a way that increases the surface area of the electrode (in three dimensions), without increasing the "foot print" of the electrode (the electrode surface area in the two dimensions along the surface of the layer of insulating material). In accordance with a preferred embodiment of the present invention, this increase in the surface area may be accomplished by providing a layer of conventional polysilicon, patterning that layer into the shape of the lower capacitor electrode, and then covering the surface of the electrode with "rugged" or hemispherical-grained silicon (HSG-Si). The core layer of polysilicon and the surface layer of HSG-Si are preferably doped to render them conductive, and then a thin layer of a conformal dielectric material is deposited over the surface of the HSG-Si to serve as the dielectric of the SRAM charge storage node capacitor. An upper plate electrode for the capacitor is provided by, for example, forming a layer of doped polysilicon conformally over the dielectric layer and patterning the layer to form an upper plate electrode. Preferably, this upper plate electrode is connected to a fixed voltage. Often, it is most convenient for the upper plate electrode to be the $V_{CC}$ line over that SRAM cell.

FIG. 1 illustrates an embodiment of a capacitor electrode that may be connected to the charge storage node of an SRAM memory cell. For clarity, most of the SRAM is not shown in the figure; rather, the figure shows the surface of an insulating layer 10 formed above the portion of the SRAM formed on the substrate. Thus, for a "4T" cell (four transistors, two polysilicon load devices such as resistors), it is possible that the insulating layer 10 covers the entire SRAM cell, while for those configurations of "6T" SRAM cells which use two thin film transistors as load devices, additional portions of the SRAM cell would be formed on the surface of the insulating layer 10. A via 12 passes through the insulating layer 10 down to the underlying portions of the SRAM cell and an interconnect 14 extends down through the insulating layer 10 into contact with a conductor (a wiring line or a doped portion of the substrate) that makes up one of the charge storage nodes of the SRAM cell. A layer of conventional polysilicon is deposited by low pressure chemical vapor deposition (LPCVD) at a temperature of from 600° C. to 650° C. or more from silane (SiH$_4$) onto the insulating layer 10, which may be silicon oxide (e.g., TEOS oxide), deposited above a silicon substrate. The layer of conventional polysilicon is doped in situ during deposition, by ion implantation and annealing, or by a thermal diffusion process, all of which are well known. Implantation or diffusion can be performed this time or at a later point in processing. For example, the polysilicon layer may be highly doped N-type by implantation of phosphorus ions followed by a rapid thermal anneal (RTA) at a temperature of 1000°–1100° C. for about 10–30 seconds. When, as here, the lower capacitor electrode is formed from doped polysilicon, it is preferred that the interconnect 14 also be made from doped polysilicon. The interconnect 14 may be formed at the same time as the electrode polysilicon is deposited or the interconnect 14 may be formed by an earlier deposition and etch back process. A plate 16, which will serve as the core of the lower electrode is defined by photolithography from the layer of conventional polysilicon.

In the FIG. 1 embodiment of the present invention, HSG-Si is grown over the surface of the polysilicon plate 16. Preferably, growth of the HSG-Si surface layer is initiated on a clean silicon surface by cleaning native oxide from the surface of the polysilicon layer 16 before depositing the HSG-Si. A distinct cleaning step may be unnecessary if the growth of the HSG-Si layer is initiated immediately after forming the underlying layer of silicon, if the surface of the underlying silicon layer is maintained in a sufficient vacuum to prevent oxide growth. More practically, it is to be expected that there will be a time interval between the growth of the underlying silicon layer and the initiation of HSG-Si growth. Alternately, if the layer of polysilicon is doped by implantation and annealing or by thermal diffusion, a layer of oxide will be grown on the surface of the layer of polysilicon. Accordingly, the surface of the underlying silicon layer is preferably cleaned before the initiation of HSG-Si growth. Native oxides may be cleaned from the surface of the polysilicon layer by a variety of techniques, including HF dip, vapor HF cleaning, or by an H$_2$ plasma cleaning.

After cleaning, a layer of HSG-Si 18 is deposited on the surface of the conventional polysilicon plate 16. This deposition may be performed by any of the well-known methods for growing HSG-Si, and may consist of depositing HSG-Si by LPCVD from silane source gas onto a substrate held at a temperature of between 570° C. to 585° C. The resulting structure is shown in FIG. 1, and includes an irregular surface of HSG-Si. Often, the HSG-Si is not doped during deposition. Accordingly, the HSG-Si layer may be doped by implantation of, for example, phosphorus, followed by an RTA process. It may be desirable to dope both the surface HSG-Si layer 18 and the polysilicon core 16 at the same time. Alternately, the HSG-Si layer may be doped by POCl$_3$ diffusion or by diffusion from the underlying polysilicon layer. An etching process may be performed on the HSG-Si layer to etch back the HSG-Si in a manner that the surface texture of the HSG-Si is reproduced on the surface of the underlying layer of doped polysilicon. An appropriate etchant might be a plasma derived from HCl and HBr, and the etch may continue until the HSG-Si is completely removed. In this way, the undoped HSG-Si layer can be etched, leaving the surface of the lower electrode as doped polysilicon having a surface texture similar to that of the HSG-Si layer. In this alternative, the layer 18 shown in FIG. 1 would be doped polysilicon after HSG-Si deposition and etch back, and no further doping process would be necessary for the lower electrode.

When the surface of a structure such as that illustrated in FIG. 1 is coated with a thin dielectric layer 20 and an upper layer of conductive material 22 is deposited on the dielectric layer 22, a high capacitive coupling can be established between the textured polysilicon layer and the upper layer of conductive material. Preferably, a second layer of heavily doped N-type polysilicon is provided as the upper layer of conductive material, and a capacitor structure like that illustrated in FIG. 1 is formed. For such a structure, it is desirable to use a dielectric layer 20 that is thin in comparison to the scale of the texture on the surface (i.e., the roughness). For the layer illustrated in FIG. 1, which typically has the surface texture associated with HSG-Si with a roughness of approximately one hundred nanometers, it would be desirable to use a dielectric layer that is less than about ten nanometers thick. An appropriate dielectric layer should be uniform, free from pinholes and have a high dielectric constant. Such a dielectric layer can be formed by depositing a layer of silicon nitride on the surface of the HSG-Si layer, for example by CVD, and then growing a thin oxide layer on the surface of the silicon nitride layer. Sometimes, such an "NO" layer is formed on top of a thin oxide layer, such as a native oxide layer, covering the surface of the textured polysilicon layer, so that the actual dielectric film formed has an "ONO" structure. This dielectric layer may be between about 40 to 200 Å thick. Alternately, a conventional thin oxide layer, a thin layer of tantalum pentoxide, a layer of a ferroelectric material such as barium strontium titanate, or other high dielectric constant material is provided.

Subsequently, the upper capacitor electrode 22 is formed by LPCVD deposition of a layer of conventional polysilicon, which is then doped and patterned according to the design considerations of the SRAM. It is preferred that the upper capacitor 22 be connected to a fixed potential, so that a consistent amount of charge is stored on the nodes. For most SRAM designs, it is particularly preferred for the upper capacitor electrode to be connected to $V_{CC}$. Depending upon the particular requirements for other wiring lines and interconnections, it may be appropriate for the upper capacitor electrode to extend over several or all of the SRAM cells. In such a configuration, the upper capacitor electrode serves as the $V_{CC}$ bus for the SRAM.

Figure 2:
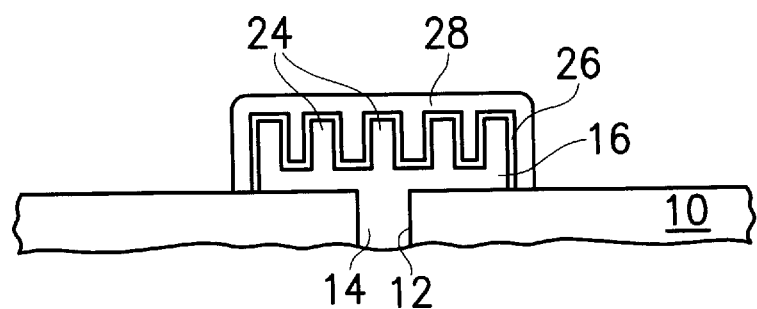

FIG. 2 illustrates a second configuration of a capacitor that may be coupled to the charge storage node to provide improved soft error immunity. As with the FIG. 1 embodiment, the FIG. 2 capacitor is formed on the surface of an insulating layer 10 and the lower electrode of the capacitor is connected to an interconnect 14 which passes through a via 12 in the insulating layer 10 to make contact with a charge storage node of the SRAM cell. Also like the FIG. 1 capacitor, the lower electrode of the FIG. 2 capacitor is formed on a plate 16 of doped polysilicon. A doped polysilicon fin structure 24 is formed above the bottom plate 16 and may, for example, be formed from polysilicon deposited on the bottom plate 16 or the combination of the fin structure 24 and the bottom plate 16 can be formed as a unitary structure. As with the FIG. 1 capacitor, the capacitor is completed by forming a conformal dielectric layer 26 over the doped polysilicon fin structure and forming an upper plate electrode 28 from doped polysilicon. The upper plate electrode 28 is preferably connected to $V_{CC}$.

A variety of different techniques might be used to form the polysilicon fin structure 24 shown in FIG. 2. The formation of fin capacitors is well-known and well developed in the art of DRAM design and any number of the methods used for forming such DRAM capacitors would be compatible with at least some embodiments of the present invention. In addition, a variety of other structures used in stacked capacitors might also be utilized in the FIG. 2 structure. For example, FIG. 2 might illustrate a cross-section through a "crown" stacked capacitor structure, in which one or more concentric cylinders or polygons are formed instead of fins. The particular configuration of capacitor to be used to increase the charge storage node capacitance for the SRAM will generally be determined by balancing the amount by which the capacitance is to be increased against the difficulty associated with manufacturing the different structures.

The stacked (fin or crown) structure of FIG. 2 might be formed as follows. After the interconnect 14 is formed through the insulating layer 10, a layer of polysilicon 3000–5000 Å thick is deposited over the surface of the insulating layer 10. Photolithography is then performed to define the lateral extent of the lower electrode and then a second mask is formed over the lower electrode. A photoresist pattern is then defined on the surface of the lower electrode and anisotropic etching using a plasma derived from HCl and HBr is performed partially through the layer of polysilicon to define fins, columns, cylinders or polygons extending vertically above a solid lower plate. If finer structures are to be formed, a photoresist mask can be formed and then a silicon nitride layer is formed by chemical vapor deposition over the photoresist mask and extending into the openings in the mask. Nitride spacers are formed along the sides of the openings in the photoresist mask by etching back the silicon nitride layer and then the photoresist is removed, leaving the silicon nitride spacers over the polysilicon layer. These silicon nitride spacers are narrower than the typical resolution limits of photolithography. The polysilicon layer is then anisotropically etched partially through using the nitride spacers as a mask forming a fin, column or other structure 24 having an even higher three dimensional surface area for a given foot print area. In these embodiments, the silicon nitride spacers are then stripped and the rest of the processing continues as discussed above.

Figure 3:
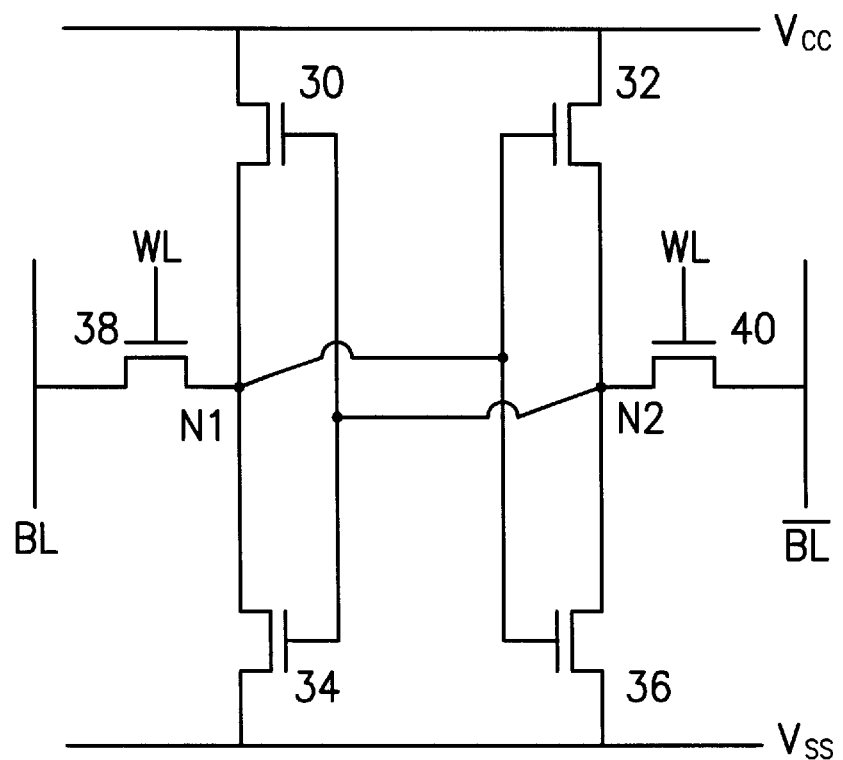
FIG. 3 is a circuit diagram of a particular embodiment of the present invention.

Aspects of the present invention can be practiced in a variety of SRAM configurations, including, but not limited to, four transistor and six transistor cells. Thus, while the following discussion emphasizes a particular implementation of a six transistor SRAM, those of ordinary skill in the art will appreciate that aspects of the invention can be implemented in a variety of different SRAM cells. FIG. 3 is a circuit diagram of a particular implementation of a six transistor SRAM cell. Other configurations are known, and so need not be discussed herein.

Referring to FIG. 3, high level ($V_{CC}$) and low level ($V_{SS}$) reference voltages are provided to each SRAM cell, and word lines (WL) and complementary bit line pairs (BL, $\overline{BL}$) are provided to address the cell and access the data stored in the cell. Two load transistors 30, 32 and two pull-down or latch transistors 34, 36 are typically interconnected with common gates and common drains to form a pair of inverters connected between the high and low reference voltages. Conventionally, the load transistors are of a different conduction type (e.g., PMOS) than the pull-down transistors (e.g., NMOS) so that the inverters have the conventional configuration. The gates of transistors 32 and 36 of one inverter pair are coupled together and to the charge storage node N1, which includes the drains of transistors 30 and 34 of the other inverter pair. Similarly, the gates of transistors 30 and 34 are coupled together and to the charge storage node N2, which includes the drains of transistors 32 and 36. Pass or transfer transistors 38 and 40 receive at their gates word line signals (WL) to selectively connect the charge storage nodes N1, N2 to the respective bit lines (BL, $\overline{BL}$) during read and write operations in the SRAM. In the illustrated embodiment, the pass transistors 38, 40 may be of the same conduction type (e.g., NMOS) as the pull-down transistors 34, 36.

Figure 4:
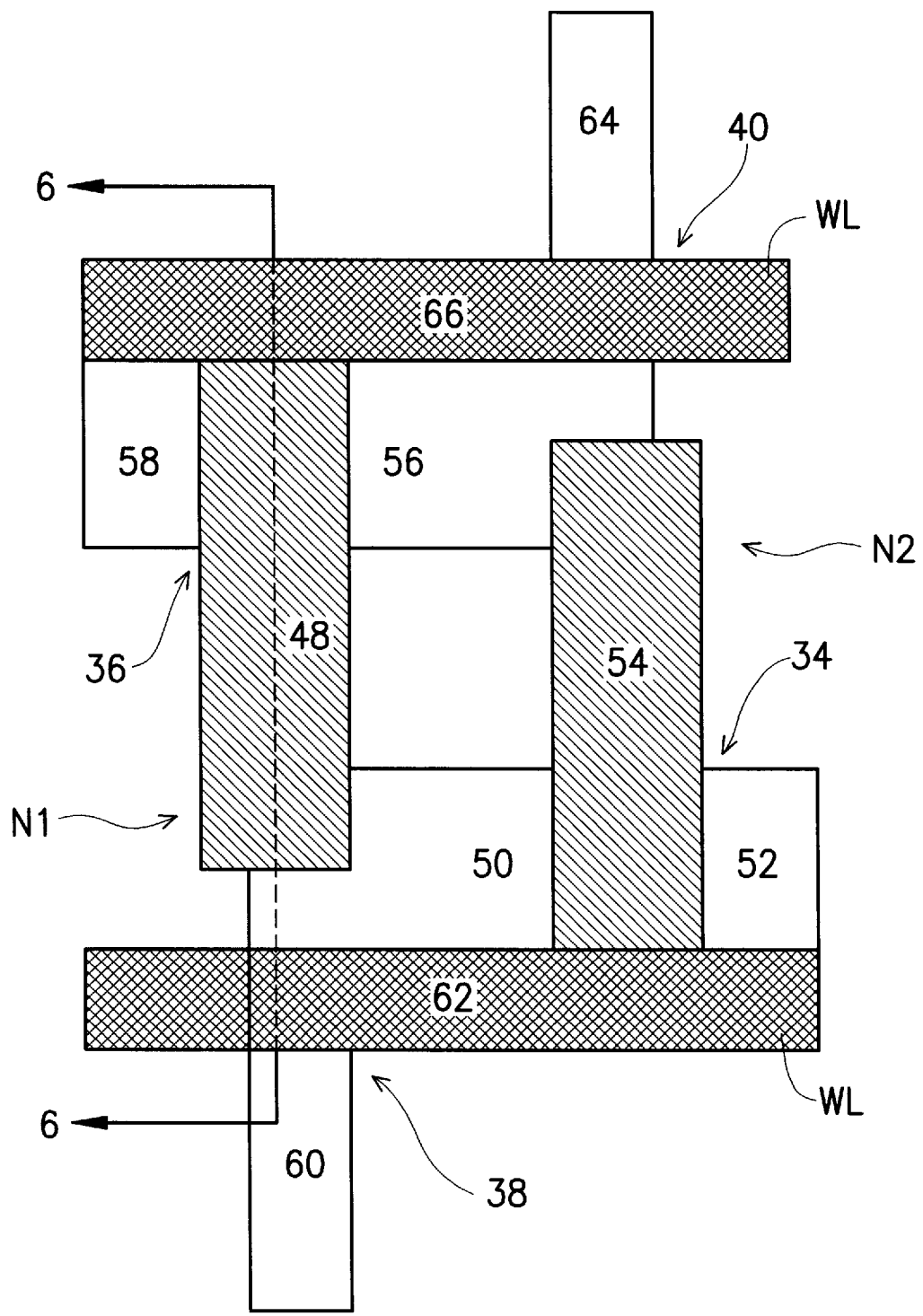
FIGS. 4 and 5 are partial plan views of different levels of an SRAM cell incorporating an aspect of the present invention.
Figure 5:
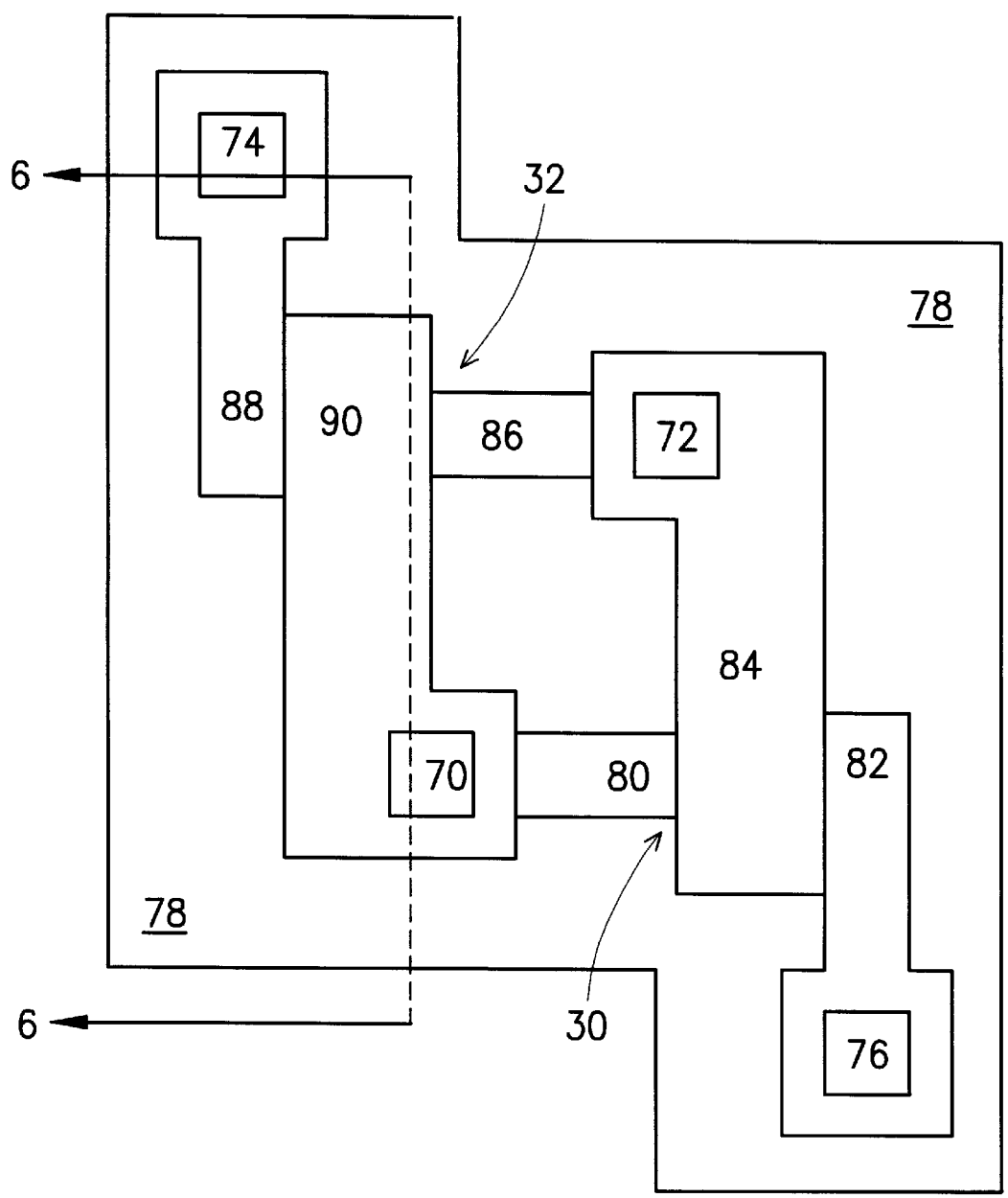

In a conventional six transistor SRAM which uses TFT load transistors, the pull-down and pass transistors are formed on the same, substrate level and the TFT load transistors are formed on a second level on top of a layer of insulating material covering the lower, substrate level. An embodiment of the present invention is illustrated in FIG. 4, which shows schematically a layout of a lower, substrate level and FIG. 5 illustrates the second, upper level of a preferred embodiment of the present invention providing a 6T-TFT SRAM. The illustrated SRAM has a symmetrical split word line structure. Charge storage node N1 includes a buried contact region formed between a polysilicon conductor 48 and a substrate region 50 doped heavily N-type. N-type region 50 is the drain and N-type region 52 is the source of pull-down transistor 34 and polysilicon conductor 54 is the gate of pull-down transistor 34. Charge storage node N2 includes the buried contact region formed between the polysilicon conductor 54 and the N-type drain region 56 formed in the substrate. N-type region 56 is the drain and N-type region 58 is the source of pull-down transistor 36. N-type regions 50 and 60 are the source/drain regions for pass transistor 38 and another conductor 62, preferably doped polysilicon, is the gate of pass transistor 38. N-type region regions 56 and 64 are the source/drain regions for pass transistor 40 and another conductor 66, preferably doped polysilicon, is the gate of the pass transistor 40. Conductors 62 and 66 are word lines for the illustrated SRAM cell.

Polysilicon conductors 48 and 54 are formed from a first layer of polysilicon deposited and then patterned on a gate oxide layer on the surface of the silicon substrate. Conductors 62 and 66 may be patterned from a second layer of polysilicon deposited on a layer of insulating material formed over the first polysilicon conductors 48 and 54. Doped source/drain regions 50, 52, 56, 58, 60 and 64 are formed by ion implantation after the first and second polysilicon layers are deposited and patterned. After this and subsequent processing, a layer of insulating material, such as TEOS oxide, is formed over the pass and pull-down transistors formed in and on the substrate.

FIG. 5 schematically illustrates the upper layer of the SRAM, formed on the layer of insulating material, showing an exemplary layout of thin film load transistors. Contact region 70 connects through a vertical interconnect to the charge storage node N1 of the lower level and contact region 72 connects through a vertical interconnect to the charge storage node N2. Contact regions 74 and 76 connect to the $V_{CC}$ line for the SRAM cell, which is illustrated in FIG. 5 as conductive plate 78, which may be a layer of doped polysilicon overlying the thin film transistors of FIG. 5. Load transistor 30 includes a drain region 80 and source region 82 formed within a third layer of polysilicon deposited on the layer of insulating material and the gate of load transistor 30 is a conductor 84 formed from a fourth polysilicon layer deposited on a gate oxide layer formed on the third layer of polysilicon. Load transistor 32 includes a drain region 86 and source region 88 formed from the third layer of polysilicon deposited on the layer of insulating material and the gate of load transistor 32 is a conductor 90 formed from the fourth polysilicon layer deposited on a gate oxide layer formed on the third layer of polysilicon. The third and fourth polysilicon layers are covered by a thin layer of oxide or other insulating material and a fifth polysilicon layer 78 is deposited. This fifth polysilicon layer is used as the $V_{CC}$ contact for the SRAM.

Figure 6:
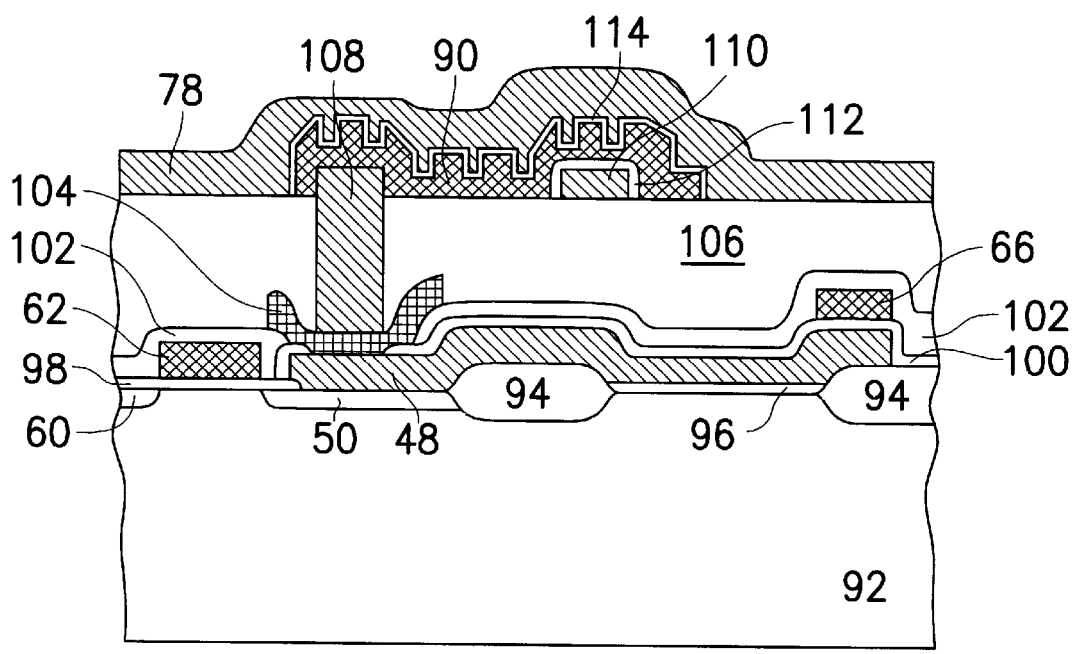
FIG. 6 is a partial elevation view of a section of the SRAM illustrated in FIGS. 4 and 5.

FIG. 6 illustrates a sectional view through the lower level (FIG. 4) and the upper level (FIG. 5) along the sectional lines illustrated in FIGS. 4 and 5. FIGS. 4–6 are schematic and do not show at least some of the connections that are necessary to the operation of the SRAM. Referring now to FIG. 6, substrate 92 has field oxide isolation regions 94 formed on its surface. Gate oxide layer 96 covers the channel region of pull-down transistor 36 and the polysilicon gate electrode 48 extends from the source/drain contact region 50, over the field oxide region 94 and over the gate oxide 96. Another gate oxide layer 98 covers the channel region of pass transistor 38 between the drain 50 and the source 60 of the pass transistor 38. The gate 48 of the pull-down transistor is formed from a first level of doped polysilicon and the word lines 62 and 66 are preferably formed from a second level of doped polysilicon. In the illustrated embodiment, the word line 66 extends over the gate 48 of the pull-down transistor and is separated from the first polysilicon level by, for example, an insulating layer 100. Another insulating layer 102 is formed over the word lines 62, 66 and an opening is formed through the insulating layers to expose a surface of the polysilicon line 48 over the drain region 50. A "landing pad" 104 may be provided over the drain region 50 to provide an oversized contact to the charge storage node N1.

Insulating layer 106, which corresponds to the insulating layer 10 shown in FIGS. 1 and 2, covers the transistors formed on the lower level of the SRAM cell. A vertical interconnect 108, which corresponds to the vertical interconnect 14 shown in FIGS. 1 and 2, extends from the landing pad 104 to contact the gate electrode 90 of thin film load transistor 32. Gate electrode 90 extends over a channel region 110 formed in the third polysilicon layer between the drain 86 and source regions 88 and is separated from the channel region 110 by a gate oxide layer 112. A dielectric layer 112, which corresponds to the dielectric layer 20 of FIG. 1 or layer 26 of FIG. 2, covers the gate electrode 90 of the load transistor 32 and the fifth polysilicon layer 78 covers the dielectric layer 112.

Gate electrode 90, dielectric layer 112 and fifth polysilicon layer 78 form a charge storage capacitor connected to charge storage node N1 and gate electrode 84, dielectric layer 112 and fifth polysilicon layer 78 form a charge storage capacitor connected to charge storage node N2. As shown for gate electrode 90 in FIG. 6, the surfaces of load transistor gate electrodes 84 and 90 are textured to provide increased capacity for the capacitors connected to the charge storage nodes. This surface texture of the gate electrodes 84 and 90 can be either the "rugged" HSG-Si surface illustrated in FIG. 1 or the stacked (fin, crown, etc.) structure illustrated in FIG. 2. Providing an HSG-Si layer such as that described above with reference on a polysilicon plate can increase the capacitance by a factor of two or more over a flat plate electrode. As is evidenced by the cross-sectional structure of FIG. 2, providing a stacked structure on a polysilicon plate can increase the capacitance by a factor of at least two beyond that provided by a flat plate electrode. Preferably, the dielectric layer 114 shown in FIG. 6 is a high dielectric constant material having a thickness on the order of 40–200 Å. As such, the capacitance of the charge storage nodes of the SRAM structure illustrated in FIGS. 4–6 is significantly improved over conventional configurations. This additional capacitance provides an improved margin above the charge storage level at which random charge generation events such as the normal occurrence of alpha particles can cause the corruption of data stored in the SRAM cell.

While the present invention has been described in terms of certain preferred embodiments, those of ordinary skill will appreciate that various modifications and alterations to the embodiments described herein might be made without altering the basic function of the present invention. Accordingly, the scope of the present invention is not limited to the particular embodiments described herein; rather, the scope of the present invention is to be determined from the following claims.

What is claimed:

1. An SRAM comprising word lines and bit lines for accessing an SRAM cell, the SRAM cell comprising:

a first transistor having a first gate, and a first source/drain region connected to a first charge storage node;

a second transistor having a second gate, and a second source/drain region connected to a second charge storage node; and a first charge storage capacitor connected to the first charge storage node;

wherein the first sate is connected to the second charge storage node and the second gate is connected to the first charge storage node, and the first charge storage capacitor has a textured lower electrode, a dielectric layer, and an upper electrode, separate from any source/drain region, that is connected to a constant potential;

wherein the textured lower electrode decreases soft error occurrence in said SRAM.

2. The SRAM of claim 1, wherein the textured lower electrode comprises doped polysilicon and has a surface layer comprising hemispherical grained polysilicon.

3. The SRAM of claim 1, wherein the textured lower electrode comprises doped polysilicon and has a surface layer with a texture corresponding to etched hemispherical grained polysilicon.

4. The SRAM of claim 1, wherein the textured lower electrode comprises doped polysilicon having one or more conductors extending vertically from a core portion of the textured lower electrode.

5. The SRAM of claim 1, wherein the textured lower electrode has a plurality of doped polysilicon structures selected from a group consisting of fins, cylinders, and columns on the surface of the textured lower electrode.

6. The SRAM of claim 1, the SRAM cells further comprising a second charge storage capacitor connected to the second charge storage node, the second charge storage node having a textured lower electrode, a dielectric layer, and an upper electrode that is connected to the constant potential.

7. The SRAM of claim 6, the SRAM cells further comprising a first transfer transistor coupled between the first charge storage node and a first bit line, and a second transfer transistor coupled between the second charge storage node and a second bit line, wherein the first and second transistors and the first and second transfer transistors are disposed at a surface of a substrate.

8. The SRAM of claim 7, further comprising a layer of insulating material over the first and second transistors and the first and second transfer transistors, wherein the first and second charge storage capacitors are formed above the layer of insulating material.

9. The SRAM of claim 8, further comprising first and second load transistors connected to the first and second charge storage nodes, respectively, and formed above the layer of insulating material, the first and second load transistors having source regions separate from the upper electrodes of the first and second charge storage capacitors.

10. An SRAM having a cell comprising:

a first inverter coupled between a higher reference potential and a lower reference potential, the first inverter comprising a first load transistor and a first pull-down transistor, wherein a drain of the first load transistor is coupled to a drain of the first pull-down transistor, and a gate of the first load transistor is coupled to a gate of the first pull-down transistor;

a second inverter coupled between the higher reference potential and the lower reference potential, the second inverter comprising a second load transistor and a second pull-down transistor, wherein a drain of the second load transistor is coupled to a drain of the second pull-down transistor, a gate of the second load transistor is coupled to a gate of the second pull-down transistor, the gate of the second pull-down transistor is coupled to the drain of the first pull-down transistor, and the gate of the first pull-down transistor is coupled to the drain of the second pull-down transistor;

a first capacitor connected between the gate of the first load transistor and the higher reference potential at a region separate from a source region of the first load transistor, the first capacitor comprising first means for increasing capacitance above a parallel plate capacitance level; and a second capacitor connected between the gate of the second load transistor and the higher reference potential at a region separate from a source region of the second load transistor, the second capacitor comprising second means for increasing capacitance above a parallel plate capacitance level;

wherein the first and second means decrease soft error occurrence in said SRAM.

11. The SRAM of claim 10, wherein the first capacitor further comprises a dielectric layer covering the first means, and the second capacitor further comprises the dielectric layer covering the second means, and wherein a conductive layer separate from the source regions of the first and second load transistors covers the dielectric layer over the first means and the second means.

12. The SRAM of claim 11, wherein the first and second means each comprise polysilicon having a surface texture characteristic of hemispherical-grained polysilicon.

13. The SRAM of claim 12, wherein the first and second means each comprise a surface layer of hemispherical-grained polysilicon.

14. The SRAM of claim 11, wherein the first and second means each comprise a plurality of polysilicon structures selected from a group consisting of fins, cylinders, and columns.

15. The SRAM of claim 11, wherein the first and second load transistors are thin film transistors.

16. The SRAM of claim 15, the SRAM cells further comprising a first transfer transistor coupled between the drain of the first pull-down transistor and a first bit line, and a second transfer transistor coupled between the drain of the second pull-down transistor and a second bit line, wherein the first and second pull-down transistors and the first and second transfer transistors are disposed at a surface of a substrate.

17. The SRAM of claim 16, further comprising a layer of insulating material over the first and second pull-down transistors and the first and second transfer transistors, wherein the first and second load transistors are formed above the layer of insulating material.

18. The SRAM of claim 17, wherein the first and second capacitors are formed above the layer of insulating material.

* * * * *